United States Patent [19]

Abe et al.

[11] Patent Number: 4,808,489
[45] Date of Patent: Feb. 28, 1989

[54] METHOD OF PRODUCING MAGNETIC DISC

[75] Inventors: Toshiro Abe, Tokyo; Toshikazu Nishihara, Zama, both of Japan

[73] Assignee: Victor Company of Japan, Ltd., Japan

[21] Appl. No.: 106,141

[22] Filed: Oct. 8, 1987

Related U.S. Application Data

[62] Division of Ser. No. 913,710, Sep. 30, 1986, Pat. No. 4,776,938.

[30] Foreign Application Priority Data

Oct. 7, 1985 [JP] Japan ............................. 60-221860
Oct. 7, 1985 [JP] Japan ............................. 60-221861

[51] Int. Cl.$^4$ ........................... G11B 5/64; H01F 10/00
[52] U.S. Cl. .................................. 428/336; 204/192.15; 204/192.2; 427/131; 428/694; 428/900
[58] Field of Search .................. 428/336, 694, 900; 427/48, 130, 131; 204/192.15, 192.2

[56] References Cited

U.S. PATENT DOCUMENTS 4,540,600 9/1985 Kobayashi et al. ................. 427/131
4,696,831 9/1987 Sakaguchi et al. ................. 427/130
4,698,251 10/1987 Fukuda ............................... 427/131

OTHER PUBLICATIONS

"Oblique-Incidence Anisotropy in Evaporated Permalloy Films" by D. O. Smith, M. S. Cohen and G. P. Weiss, Journal of Applied Physics vol. 31, No. 10, Oct. 1960.

*Primary Examiner*—Paul J. Thibodeau
*Attorney, Agent, or Firm*—Andrus, Sceales, Starke & Sawall

[57] ABSTRACT

A magnetic disc comprises a non-magnetic underlayer formed on a substantially flat surface of a substrate by growing grains of a magnetic material in a circumferential direction of the magnetic disc, and a magnetic layer formed on the non-magnetic underlayer, where the magnetic easy axis of the magnetic layer is oriented in the circumferential direction of the magnetic disc. A method of producing the magnetic disc forms the magnetic layer so that the magnetic easy axis thereof becomes oriented in the circumferential direction of the magnetic disc.

4 Claims, 5 Drawing Sheets

METHOD OF PRODUCING MAGNETIC DISC

The present application is a divisional application of U.S. patent application Ser. No. 913,710 filed Sept. 30, 1986, now U.S. Pat. No. 4,776,938.

BACKGROUND OF THE INVENTION

The present invention generally relates to magnetic discs and methods of producing magnetic discs, and more particularly to a magnetic disc comprising a magnetic layer in which an axis of easy magnetization (hereinafter simply referred to as magnetic easy axis) is oriented in a circumferential direction of the magnetic disc and a method of producing such a magnetic disc.

For example, a conventional magnetic disc comprising a thin film made of a magnetic material is produced by carrying out a magnetron sputtering by use of a ring-shaped magnet. In the present specification, such a magnetron sputtering using the ring-shaped magnet will be referred to as a ring magnetron sputtering. When a non-magnetic underlayer having a film thickness of 3000Å to 4000Å by use of chromium (Cr) and a magnetic layer having a film thickness of 700Å to 800Å by use of cobalt-nickel (CoNi) are formed on the magnetic disc by the ring magnetron sputtering, it is only possible to obtain a coercive force (coercivity) Hc of 795 Oe, a squareness ratio Rs of 0.71, a coercive squareness S* of 0.74, a resolution of 91.9%, a half-value width $W_{50}$ of the solitary reproduced waveform of 1.96 microns, and a density characteristic $D_{50}$ of 16.82 kilobits per inch (KBPI). Accordingly, the static magnetic characteristic and the magnetoelectric conversion characteristic of the magnetic disc produced by the conventional method are unsatisfactory.

The present inventors studied in detail the magnetic disc produced by the conventional method, and found that the reason why the static magnetic characteristic and the magnetoelectric conversion characteristic of the magnetic disc produced by the conventional method are unsatisfactory is because the magnetic easy axis of the magnetic layer is oriented at random. In addition, the present inventors also found that the static magnetic characteristic and the magnetoelectric conversion characteristic of the magnetic disc are greatly improved when the magnetic easy axis of the magnetic layer is oriented in the circumferential direction of the magnetic disc.

However, according to the physical vapor deposition (PVD) such as the conventional sputtering, it is impossible to form the magnetic layer of the magnetic disc so that the magnetic easy axis of the magnetic layer becomes oriented in the circumferential direction of the magnetic disc.

On the other hand, a method has been proposed according to which a spiral groove or a plurality of concentric grooves are formed on a substrate and the magnetic layer is thereafter formed on the substrate by the conventional sputtering. In this case, since the groove or grooves on the substrate are formed in the circumferential direction of the magnetic disc, the magnetic easy axis of the magnetic layer becomes oriented in the circumferential direction due to the shape anisotropy thereof although the magnetic layer is formed by the conventional sputtering. However, according to this proposed method, there is a problem in that the substrate must be heated during the sputtering in order to ensure that grains of the magnetic layer grow in the circumferential direction of the magnetic disc. In other words, the substrate must be heated so that the grains of the magnetic layer become deposited on the substrate as chains having long axes of the grains aligned substantially in the circumferential direction. As a result, this proposed method suffers problems in that there is a need to form the groove or grooves on the substrate and that it is impossible to use a material such as plastic which cannot withstand heat for the substrate which must be heated during the sputtering described above.

SUMMARY OF THE INVENTION

Accordingly, it is a general object of the present invention to provide a novel and useful magnetic disc and a method of producing the magnetic disc, in which the problems described heretofore are eliminated.

Another and more specific object of the present invention is to provide a magnetic disc comprising a non-magnetic underlayer formed on a substantially flat surface of a substrate by growing grains of a magnetic material in a circumferential direction of the magnetic disc, and a magnetic layer formed on the non-magnetic underlayer, where the magnetic easy axis of the magnetic layer is oriented in the circumferential direction of the magnetic disc. According to the magnetic disc of the present invention, it is possible to obtain satisfactory static magnetic characteristic and magnetoelectric conversion characteristic because the magnetic easy axis of the magnetic layer is oriented in the circumferential direction.

Still another object of the present invention is to provide a method of producing a magnetic disc, wherein a magnetic layer is formed so that the magnetic easy axis thereof becomes oriented in a circumferential direction of the magnetic disc. According to the method of the present invention, it is possible to produce a magnetic disc having satisfactory static magnetic characteristic and magnetoelectric conversion characteristic because the magnetic easy axis of the magnetic layer becomes oriented in the circumferential direction.

Other objects and further features of the present invention will be apparent from the following detailed description when read in conjunction with the accompanying drawings.

DETAILED DESCRIPTION

Figure 1:
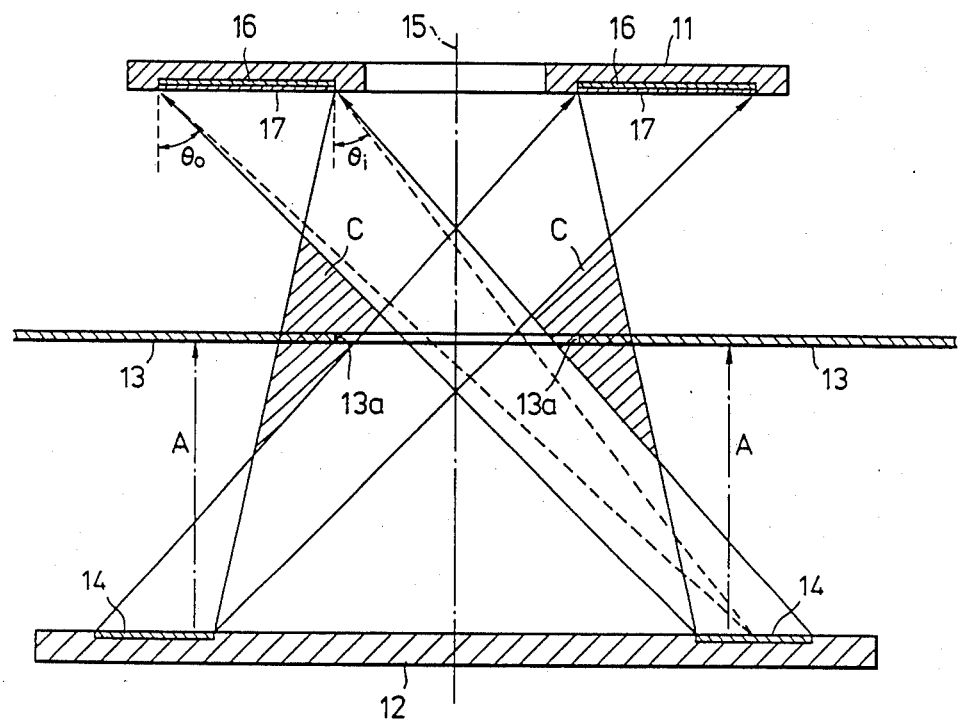
FIG. 1 is a diagram for explaining a first embodiment of the method of producing the magnetic disc according to the present invention.

First, description will be given with respect to a first embodiment of the method of producing the magnetic disc according to the present invention. In FIG. 1, a disc-shaped substrate 11 of a magnetic disc is made of aluminum (Al), for example, and a mask 13 is arranged between the substrate 11 and a target 12. A circular hole 13a is formed in the mask 13. When chromium (Cr) is sputtered by the ring magnetron sputtering with an argon gas pressure of 8 mTorr, Cr particles are dislodged from a ring-shaped erosion area 14 on the target 12. Out of these Cr particles dislodged from the erosion area 14, those Cr particles moving across an imaginary center axis 15 of the substrate 11 are deposited on the substrate 11 and form a non-magnetic Cr underlayer 16 having a film thickness of approximately 750Å to 5000Å. Next, when cobalt-nickel (CoNi) is sputtered on the underlayer 16, CoNi particles are dislodged from the erosion area 14. Out of these CoNi particles dislodged from the erosion area 14, those CoNi particles moving across the imaginary center axis 15 are deposited on the underlayer 16 and form a magnetic CoNi layer 17 having a film thickness of approximately 400Å to 800Å. It is of course possible to form the underlayer 16 and the magnetic layer 17 on both sides of the substrate 11.

Figure 2:
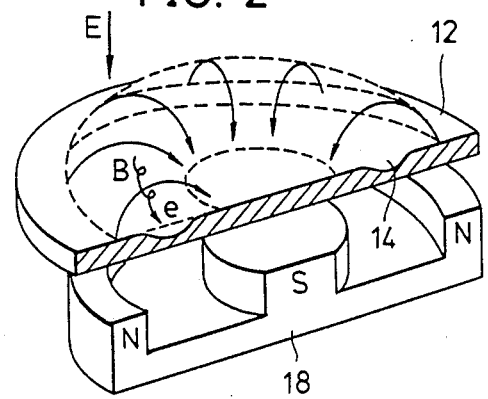
FIG. 2 is a cross sectional view for explaining a ring magnetron sputtering.

FIG. 2 is a cross sectional view for explaining the ring magnetron sputtering. In FIG. 2, those parts which are the same as those corresponding parts in FIG. 1 are designated by the same reference numerals, and description thereof will be omitted. A ring-shaped magnet 18 is arranged below the target 12 and generates a magnetic field indicated by arrows. In FIG. 2, E denotes the electrical field, B denotes the magnetic flux density, and e indicates the electron movement. The magnetic flux B at the target surface is approximately 300 G to 500 G. In the present embodiment, a sputtering chamber (not shown) is evacuated to less than $5 \times 10^{-7}$ Torr, and the sputtering is thereafter carried out with a sputtering power of 7 kW (12.7 A, 550 V). The substrate 11 is not heated.

When the ring magnetron sputtering is carried out by use of the mask 13, a particle which is dislodged from the erosion area 14 as indicated by a one-dot chain line A in FIG. 1 is blocked by the mask 13 and will not reach the substrate 11. In other words, the particles which reach the substrate 11 are only the particles which move across the imaginary center axis 15 of the substrate 11. The present inventors found that when the dislodged particles moving across the imaginary center axis 15 are deposited on the substrate 11, grains constituted by the particles grow in a circumferential direction of the substrate 11 due to the self-shadowing effect. That is, the grains constituted by such dislodged particles which move across the imaginary center axis 15 and become deposited on the substrate 11 have long axes thereof oriented in the circumferential direction. The self-shadowing effect is described in an article "Oblique-Incidence Anisotropy in Evaporated Permalloy Films" by D. O. Smith, M. S. Cohen and G. P. Weiss, Journal of Applied Physics Vol. 31, No. 10, October 1960.

Accordingly, the underlayer 16 is constituted by the Cr grains growing in the circumferential direction of the magnetic disc so that the long axes of the Cr grains are oriented in the circumferential direction. The magnetic layer 17 is constituted by CoNi grains growing in the circumferential direction so that the long axes of the CoNi grains are oriented in the circumferential direction, and for this reason, the magnetic easy axis of the magnetic layer 17 is also oriented in the circumferential direction. As a result, the static magnetic characteristic and the magnetoelectric convertion characteristic of the magnetic disc is greatly improved.

When the edge of the opening 13a of the mask 13 is located within a region C indicated by the hatchings in FIG. 1, only those dislodged particles moving across the imaginary center axis 15 are deposited on the substrate 11. Hence, it is desirable that the edge of the opening 13a is located within the region C. It is possible to obtain similar effects when the edge of the opening 13a is located on the inner side of the region C and closer to the imaginary center axis 15 than the region C, but the sputtering time becomes long in this case.

In the description given heretofore, both the underlayer 16 and the magnetic layer 17 are formed by sputtering Cr and CoNi using the mask 13, respectively. However, since the Cr grains become oriented in the circumferential direction when the ring magnetron sputtering is carried out by use of the mask 13, it is possible to form the magnetic layer 17 by carrying out the conventional ring magnetron sputtering without the use of the mask 13. It was confirmed that the magnetic layer 17 is affected by the grain orientation (that is, shape anisotropy) of the underlayer 16 and the magnetic easy axis of the magnetic layer 17 becomes oriented in the circumferential direction even when the magnetic layer 17 is formed by the conventional ring magnetron sputtering without the use of the mask 13.

Figure 3:
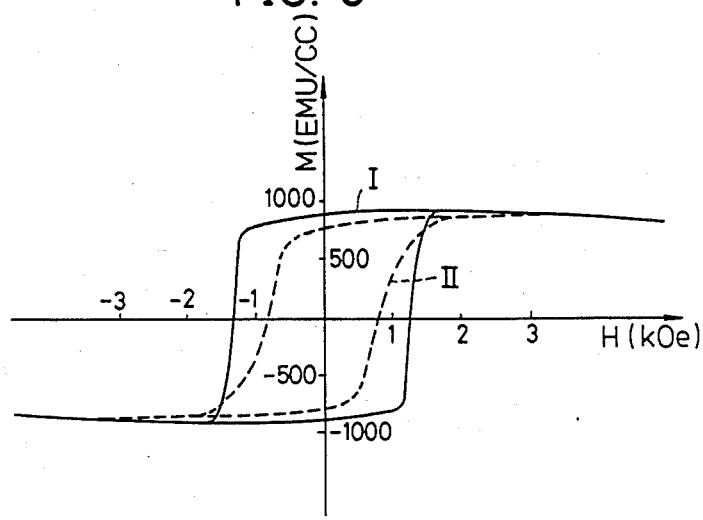
FIGS. 3 through 7 respectively are graphs for explaining characteristics of the magnetic disc produced by the method of the present invention.

In FIG. 3, a characteristic I indicates the hysteresis loop of the magnetic disc which is obtained by forming only the underlayer 16 by the ring magnetron sputtering using the mask 13 and forming the magnetic layer 17 by the conventional magnetron sputtering without the use of the mask 13. In this case, the ring magnetron sputtering processes are respectively carried out by use of Cr and $Co_{82}Ni_{18}$ alloy targets 12 having a diameter of eight inches in a D.C. magnetron system. The mask 13 is arranged at a position 40 mm from the substrate 11 so that the edge of the opening 13a having a diameter of 80 mm is located within the region C. An Al substrate having a diameter of 89 mm is used for the substrate 11, and a distance between the substrate 11 and the target 12 is set to 76 mm. An average diameter of the erosion area 14, that is, the diameter whereat the erosion is largest, is set to 158 mm. In FIG. 3, a characteristic II indicates an example of the hysteresis loop of the magnetic disc which is obtained by forming the underlayer and the magnetic layer by the conventional ring magnetron sputtering without the use of the mask 13. The hysteresis loops I and II are obtained by carrying out the measurements with a field applied in a direction parallel to the circumferential direction of the disc, that is, in a direction parallel to a tangential direction of the magnetic disc.

As may be seen from FIG. 3, the magnetic disc produced by the method of the present embodiment has a coercive force Hc of approximately 1400 Oe, squareness ratio Rs of approximately 0.82, coercive squareness S* of approximately 0.94, resolution of approximately 95.7%, half-value width $W_{50}$ of the solitary reproduced waveform of approximately 1.62 microns, and density characteristic $D_{50}$ of approximately 23.0 KBPI. Hence, the static magnetic characteristic and the magnetoelectric conversion characteristic of the magnetic disc produced by the method of the present invention is greatly improved compared to those of the magnetic disc produced by the conventional method.

Figure 4:
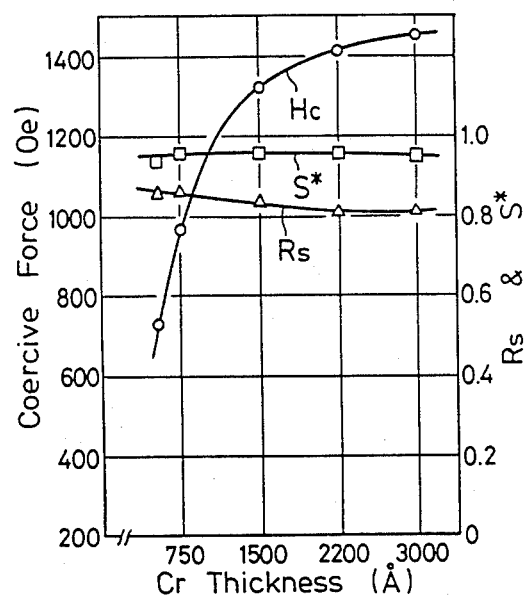

FIG. 4 shows the relationship between the film thickness of the underlayer 16 formed by the sputtering using the mask 13 and the magnetic characteristic of the magnetic disc. In FIG. 4 and FIGS. 5 through 7 which will be described later, Hc, Rs and S* represent values at a position on the magnetic disc where the diameter is 45 mm. FIG. 4 shows the case where the sputtering is carried out with the argon gas pressure of 8 mTorr, the substrate temperature is 30° C., and the film thickness of the magnetic layer 17 is 420 Å.

Figure 5:
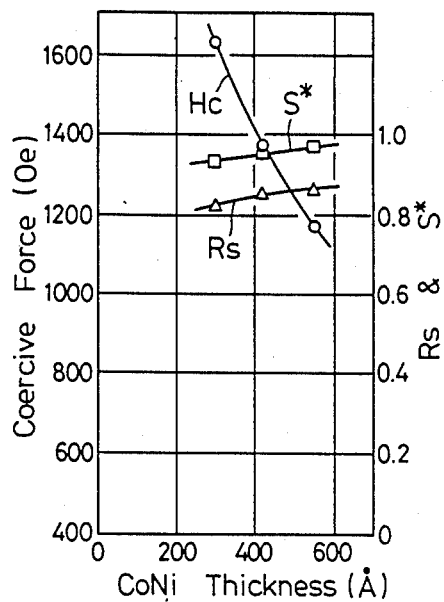

FIG. 5 shows the relationship between the film thickness of the magnetic layer 17 formed by the sputtering using the mask 13 and the magnetic characteristic of the magnetic disc. The sputtering is carried out with an argon gas pressure and a substrate temperature identical to those of the case shown in FIG. 4, and the film thickness of the underlayer 16 is 3000Å. It can be regarded that the reason why the coercive force Hc is large at the outer peripheral portion of the magnetic disc although the film thickness of the underlayer 16 is small at the outer peripheral portion is because an incident angle $\theta_0$ of the dislodged particles to the substrate 11 at the outer peripheral portion of the magnetic disc is large compared to an incident angle $\theta_1$ at the inner peripheral portion and the grains are strongly oriented in the circumferential direction of the magnetic disc at the outer peripheral portion due to the self-shadowing effect. In other words, there is strong shape anisotropy at the outer peripheral portion of the magnetic disc.

Figure 6:
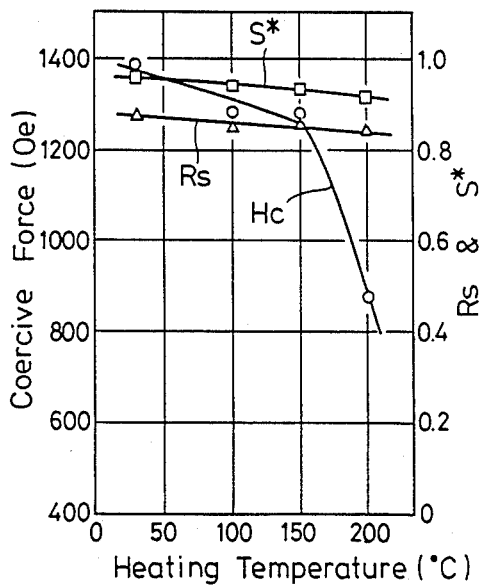

FIG. 6 shows the relationship between the substrate temperature and the magnetic characteristic of the magnetic disc. The sputtering is carried out with an argon gas pressure identical to that of the case shown in FIG. 4, the film thickness of the underlayer 16 formed by using the mask 13 is 3000Å, and the film thickness of the magnetic layer 17 is 420Å. It can be regarded that the reason why the coercive force Hc becomes small for substrate temperatures of over 150 ° C. is because the Cr atoms more easily diffuse into the shadowed region.

Figure 7:
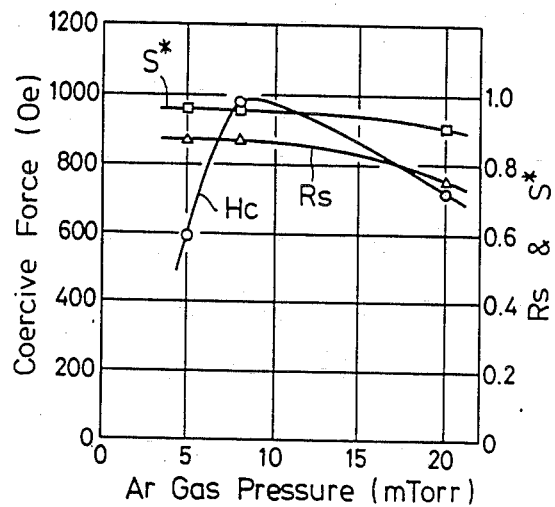

FIG. 7 shows the relationship between the argon gas pressure and the magnetic characteristic of the magnetic disc. The sputtering is carried out with a substrate temperature identical to that of the case shown in FIG. 4, the film thickness of the underlayer 16 formed by using the mask 13 is 750Å, and the film thickness of the magnetic layer 17 is 420 Å.

As may be seen from FIGS.4 through 7, it is possible to obtain satisfactory results when the argon gas pressure is in a range of 5 mTorr to 20 mTorr and the substrate temperature is under 150° C. Furthermore, the squareness ratio Rs and the coercive squareness S* are approximately constant.

Since it is possible to obtain a magnetic disc with a satisfactory magnetic characteristic when the magnetic easy axis of the magnetic layer is oriented in the circumferential direction of the magnetic disc, the underlayer may be formed by the conventional method and only the magnetic layer may be formed by the method according to the present invention.

Figure 8:
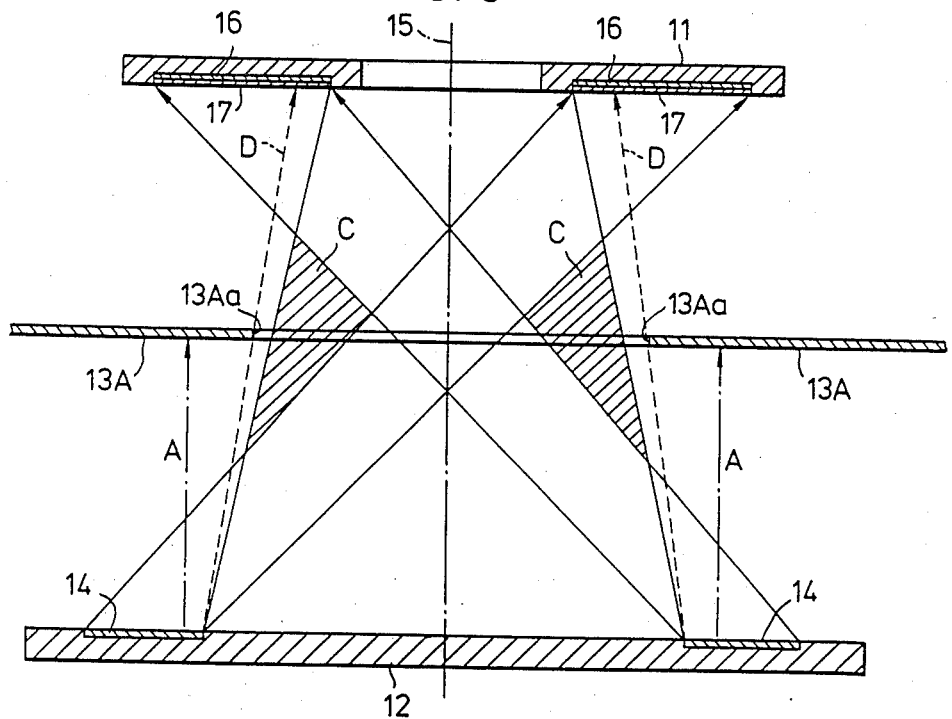
FIG. 8 is a diagram for explaining a modification of the first embodiment.

FIG. 8 shows a modification of the first embodiment described before. In FIG. 8, those parts which are the same as those corresponding parts in FIG. 1 are designated by the same reference numerals, and description thereof will be omitted. In the present modification, the edge of a circular opening 13Aa of a mask 13A is slightly on the outside of the region C. Accordingly, out of the dislodged particles from the erosion area 14 which reach the substrate 11, there are particles which do not move across the imaginary center axis 15. However, since the majority of the dislodged particles which become deposited on the substrate 11 move across the imaginary center axis 15, the grains grow with the long axes thereof oriented in the circumferential direction of the magnetic disc. As a result, it is possible to produce a magnetic disc having a satisfactory magnetic characteristic similar to that of the magnetic disc produced according to the first embodiment. In the present modification, te opening 13Aa of the mask 13A is larger than the opening 13a of the mask 13 described before, and for this reason, it is possible to reduce the sputtering time.

Figure 9:
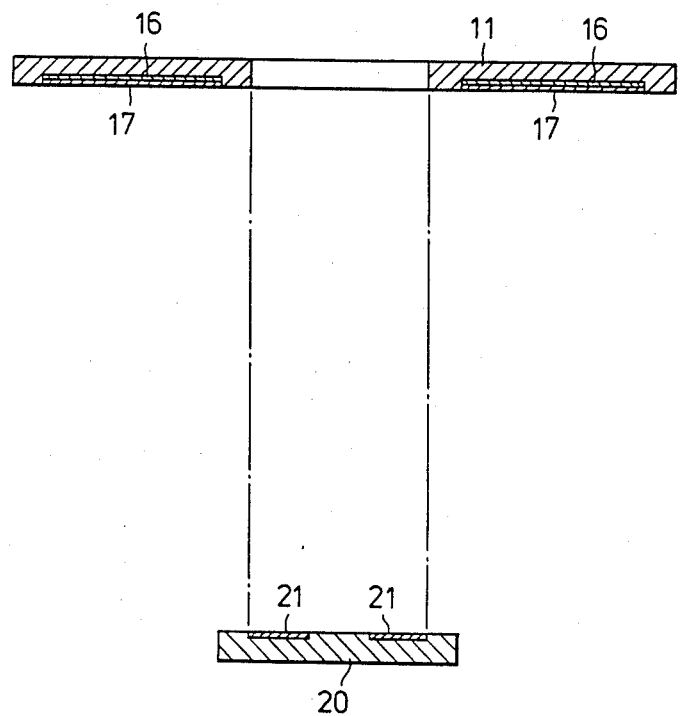
FIG. 9 is a diagram for explaining a second embodiment of the method of producing the magnetic disc according to the present invention.

FIG. 9 shows a second embodiment of the method of producing the magnetic disc according to the present invention. In FIG. 9, those parts which are the same as those corresponding parts in FIG. 1 are designated by the same reference numerals, and description thereof will be omitted. In the present embodiment, an outer diameter of the erosion area of the target is set smaller than an inner diameter of the magnetic layer of the magnetic disc, and a physical vapor deposition (PVD) is carried out with the substrate of the magnetic disc and the target arranged substantially coaxially.

The outer diameter of an erosion area 21 of a target 20 is smaller than the inner diameter of the magnetic layer 17 which is to be formed on the substrate 11, as indicated by a one-dot chain line. First, the ring magnetron sputtering is carried out by use of Cr so as to dislodge the Cr particles from the erosion area 21 and form on the substrate 11 the underlayer 16 having a film thickness of approximately 750Å to 5000Å. Next, the ring magnetron sputtering is carried out by use of CoNi so as to dislodge the CoNi particles from the erosion area 21 and form on the underlayer 16 the magnetic layer 17 having a film thickness of approximately 400Å to 800Å.

The magnetic disc produced by the method of the present embodiment has a coercive force Hc of approximately 1200 Oe, squareness ratio Rs of approximately 0.80, coercive squareness S* of approximately 0.92, resolution of approximately 93.1%, half-value width $W_{50}$ of the solitary reproduced waveform of approximately 1.70 microns, and density characteristic $D_{50}$ of approximately 20.5 KBPI. Hence, it is possible to obtain a magnetic disc having satisfactory static magnetic characteristic and magnetoelectric conversion characteristic.

As in the case of the first embodiment described before, the method of the present embodiment may be used to form only the underlayer 16, only the magnetic layer 17, or both the underlayer 16 and the magnetic layer 17. In each case, the grains of the magnetic layer 17 become oriented in the circumferential direction of the magnetic disc due to the self-shadowing effect, and the magnetic easy axis of the magnetic layer 17 becomes oriented in the circumferential direction.

In the first embodiment and the modification thereof, the sputtering is not limited to the ring magnetron sputtering and other sputtering methods may be employed. Even when other sputtering methods are employed, it is possible to obtain effects similar to those obtained in the first embodiment and the modification thereof due to the mask which is arranged between the substrate and the target.

Furthermore, in the second embodiment, the method of forming the underlayer and the magnetic layer is not limited to the ring magnetron sputtering, but other PVD methods such as sputtering and vapor deposition may be employed. Even when other PVD methods are employed, it is possible to obtain effects similar to those obtained in the second embodiment.

Figure 10:
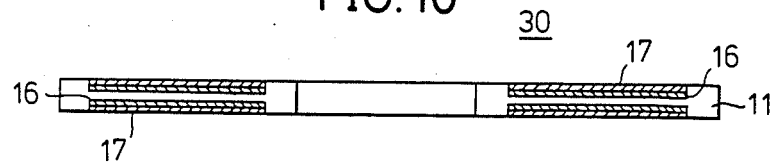
FIG. 10 is a cross sectional view showing an embodiment of the magnetic disc according to the present invention.

FIG. 10 shows an embodiment of the magnetic disc produced by the method according to the present invention. In FIG. 10, those parts which are the same as those corresponding parts in FIG. 1 are designated by the same reference numerals, and description thereof will be omitted. A magnetic disc 30 comprises the non-magnetic underlayer 16 and the magnetic layer 17 on both sides of the substrate 11. The underlayer 16 is formed on a substantially flat surface of the substrate 11 by the method of the present invention, and in the underlayer 16 the grains are oriented in the circumferential direction of the magnetic disc 20. The magnetic layer 17 is formed on the underlayer 16 by the method of the present invention or by the conventional method. The magnetic layer 17 is affected by the grain orientation of the underlayer 16, and the magnetic easy axis of the magnetic layer 17 is oriented in the circumferential direction. In other words, the shape anisotropy of the underlayer 16 is reflected to the magnetic layer 17. For example, the underlayer 16 is made of Cr, and the magnetic layer is made of CoNi.

According to the method of the present invention and the magnetic disc according to the present invention, the magnetic easy axis of the magnetic layer is oriented in the circumferential direction of the magnetic disc, and for this reason, it is possible to obtain a magnetic disc having satisfactory static magnetic characteristic and magnetoelectric conversion characteristic. In addition, the magnetic layer in which the magnetic easy axis is oriented in the circumferential direction can be formed on the substrate of the magnetic disc without having to provide special grooves on the substrate. Moreover, since a satisfactory magnetic layer can be formed on the substrate without the need to heat the substrate, it is possible to use for the substrate materials such as plastic which generally cannot withstand heat.

The materials used for the substrate, the non-magnetic underlayer and the magnetic layer are of course not limited to those of the embodiments.

Further, the present invention is not limited to these embodiments, but various variations and modifications may be made without departing from the scope of the present invention.

What is claimed is:

1. A magnetic disc comprising:

a disc-shaped substrate;

a non-magnetic underlayer formed on a substantially flat surface of said substrate, said non-magnetic underlayer being made of a non-magnetic material and having grains thereof oriented in a circumferential direction of said substrate; and a magnetic layer formed on said non-magnetic underlayer, said magnetic layer being made of a magnetic material and having a magnetic easy axis thereof oriented in the circumferential direction of said substrate due to a grain orientation of said non-magnetic underlayer.

2. A magnetic disc as claimed in claim 1, in which said non-magnetic underlayer is made of chromium and said magnetic layer is made of cobalt-nickel.

3. A magnetic disc as claimed in claim 1 in which said non-magnetic underlayer has a thickness of approximately 750Å to 5000Å and said magnetic layer has a thickness of approximately 400Å to 800 Å.

4. A magnetic disc having a disc-shaped substrate; a non-magnetic underlayer formed on a sustantially flat surface of said substrate, said non-magnetic underlayer being made of a non-magnetic material and having grains thereof oriented in a circumferential direction of said substrate; and a magnetic layer formed on said non-magnetic underlayer, said magnetic layer being made of a magnetic material and having a magnetic easy axis thereof oriented in the circumferential direction of said substrate due to a grain orientation of said non-magnetic underlayer, said magnetic disc being manufactured by a method comprising the steps of:

forming a non-magnetic underlayer made of a non-magnetic material on a disc-shaped substrate by carrying out a physical vapor deposition by use of a mask having an opening with a predetermined diameter so that grains of the non-magnetic material grow and become oriented in a circumferential direction of said substrate, said mask being arranged substantially coaxially to said substrate, and forming a magnetic layer made of a magnetic material on said non-magnetic underlayer by carrying out a physical vapor deposition, said magnetic layer having a magnetic easy axis thereof oriented in the circumferential direction of said substrate.

* * * * *